United States Patent [19]

Yamaguchi

[11] Patent Number: 4,578,715
[45] Date of Patent: Mar. 25, 1986

[54] PICTURE SIGNAL QUANTIZING CIRCUIT

[75] Inventor: Shingo Yamaguchi, Atsugi, Japan

[73] Assignee: Ricoh Company, Ltd., Tokyo, Japan

[21] Appl. No.: 579,329

[22] Filed: Feb. 13, 1984

[30] Foreign Application Priority Data

Feb. 14, 1983 [JP] Japan ................................. 58-22574
Feb. 14, 1983 [JP] Japan ................................. 58-22575

[51] Int. Cl.[4] .............................................. H04N 1/40
[52] U.S. Cl. .................................. 358/283; 358/284; 358/282; 340/347 AD; 382/53
[58] Field of Search ............... 358/283, 284, 164, 141, 358/280, 282; 340/347 AD, 347 CC; 382/53

[56] References Cited

U.S. PATENT DOCUMENTS 4,216,465 8/1980 Huelsman et al. .......... 340/347 AD
4,496,935 1/1985 Inoue et al. ................. 340/347 AD

FOREIGN PATENT DOCUMENTS 5266525 6/1979 Japan ........................... 340/347 AD
56205234 6/1983 Japan ........................... 340/347 AD
2069793 8/1981 United Kingdom ................ 358/283

Primary Examiner—James J. Groody
Assistant Examiner—John K. Peng
Attorney, Agent, or Firm—David G. Alexander

[57] ABSTRACT

A picture signal quantizing circuit for quantizing with respect to multiple levels an analog picture signal read from a document by converting it into a digital picture signal which has a plurality of bits. An AD converter is installed in the circuit which is supplied with reference voltages corresponding to the highest and lowest levels for quantization and prepared by dividing a document background level voltage, multi-level quantizing the analog picture signal within the range defined by the two levels. The AD converter includes a circuit for accentuating half-tone of the analog picture signal to enhance the reproducibility thereof.

8 Claims, 7 Drawing Figures

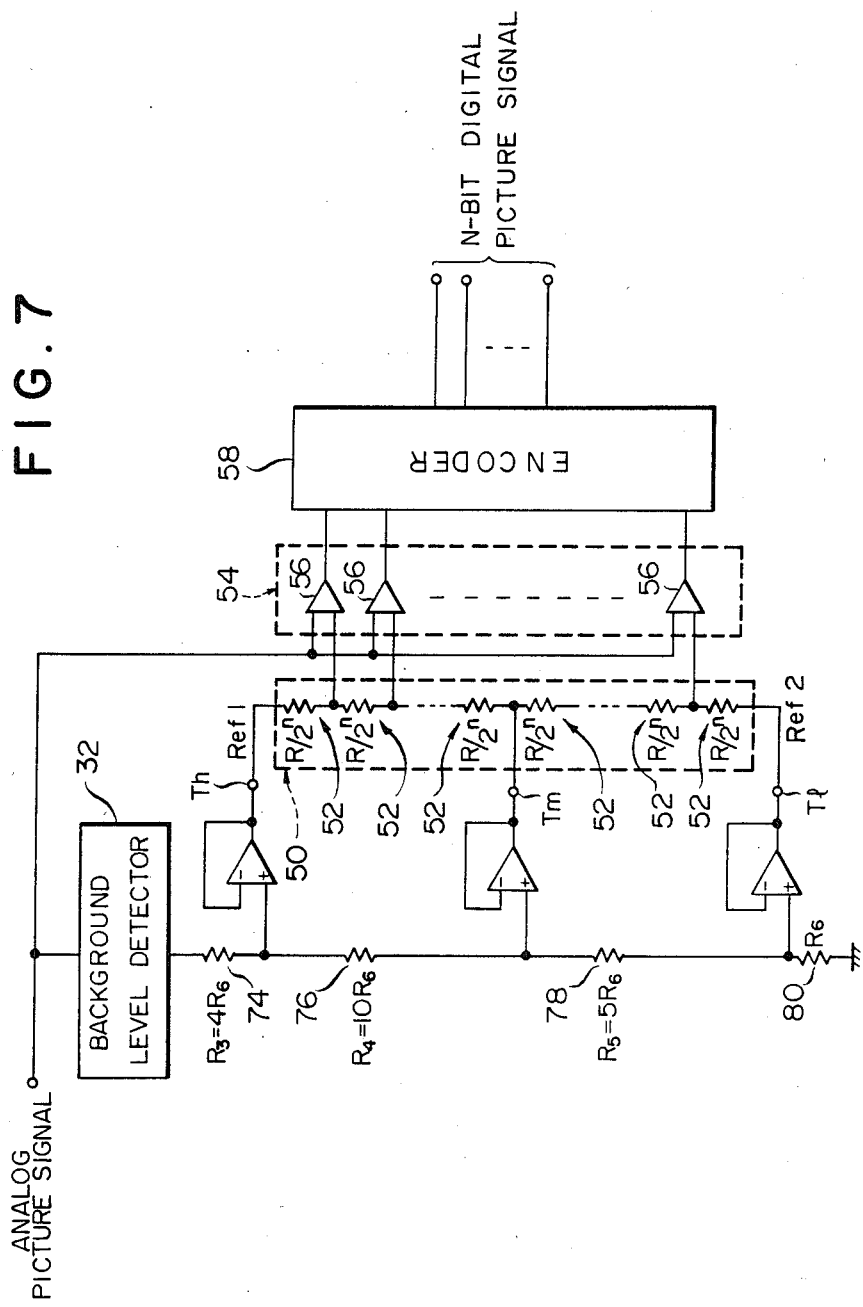

PICTURE SIGNAL QUANTIZING CIRCUIT

BACKGROUND OF THE INVENTION

The present invention relates to a picture signal quantizing circuit for quantizing with respect to multiple levels an analog image or picture signal indicative of an image or picture read from a document by causing an analog-to-digital (AD) converter to convert the picture signal into a digital picture signal having a plurality of bits.

Generally, a picture signal quantizing circuit of the type described comprises a parallel comparison type AD converter which is made up of a reference voltage divider consisting of a series connection of $2^n$ ladder resistors, a comparator circuit consisting of $(2^n-1)$ high speed comparators adapted to compare outputs from the junctions between the ladder resistors and an analog picture signal, and an encoder for preparing a digital signal as an n-bit binary code in response to outputs of the comparators. The analog picture signal is converted into the n-bit digital picture signal within the range of an upper limit reference voltage applied to one end of the series connection and a lower limit reference voltage applied to the other end.

Difficulty has been experienced in such a prior art quantizing circuit in dither processing the multi-level quantized picture signal into two levels for reproduction of halftone. Should the difference between the highest and lowest reference voltages be reduced to narrow the AD conversion range for an analog picture signal and, thereby, accentuate the contrast, the range available for the reproduction of halftone would also be reduced resulting in poor reproducibility of photographs and other halftone images. Conversely, should the AD conversion range be enlarged to attain better reproducibility of halftone, the quantization would become unfeasible for picture signals representative of characters and the like.

SUMMARY OF THE INVENTION

It is therefore an object of the present invention to provide a quantizing circuit for an analog picture signal which effectively widens a range available for reproduction of halfone without deteriorating reproducibility of characters or the like, while enhancing the reproducibility of a portion which is essential for halftone by accentuating it.

It is another object of the present invention to provide a generally improved quantizing circuit for an analog picture signal.

A picture signal quantizing circuit for multi-level quantizing with respect to multiple levels an analog picture signal representative of a picture which is read from a document of the present invention comprises a background level detector for detecting and holding a peak value of the analog picture signal to generate a background level voltage indicative of a background level of the document, a reference voltage generator for dividing the detected and held background level voltage to determine a highest level and a lowest level for quantization to generate a first reference voltage and a second reference voltage corresponding to the highest level and the lowest level respectively, a reference voltage divider comprising a series circuit having $2^n$ ladder resistors connected serially to generate different output voltages from junctions between the resistors, a first tap led out from one end of said series circuit, a second tap led out from the other end of the series circuit, and a third tap led out from a predetermined position between the first and second taps, a halftone reproducibility accentuating circuit for quantizing part of the analog image signal while accentuating the part of the analog image signal, a comparator circuit comprising $(2^n-1)$ comparators for respectively comparing the output voltages from the junctions between the resistors of the series connection with the analog video signal, and an encoder for generating a digital signal in response to outputs of the comparators, the digital signal being an n-bit binary code.

The above and other objects, features and advantages of the present invention will become more apparent from the following detailed description taken with the accompanying drawing.

BRIEF DESCRIPTION OF THE DRAWING

FIG. 7 is a diagram of another embodiment of the present invention;

DESCRIPTION OF THE PREFERRED EMBODIMENTS

While the picture signal quantizing circuit of the present invention is susceptible of numerous physical embodiments, depending upon the environment and requirements of use, substantial numbers of the herein shown and described embodiments have been made, tested and used, and all have performed in an eminently satisfactory manner.

Figure 1:
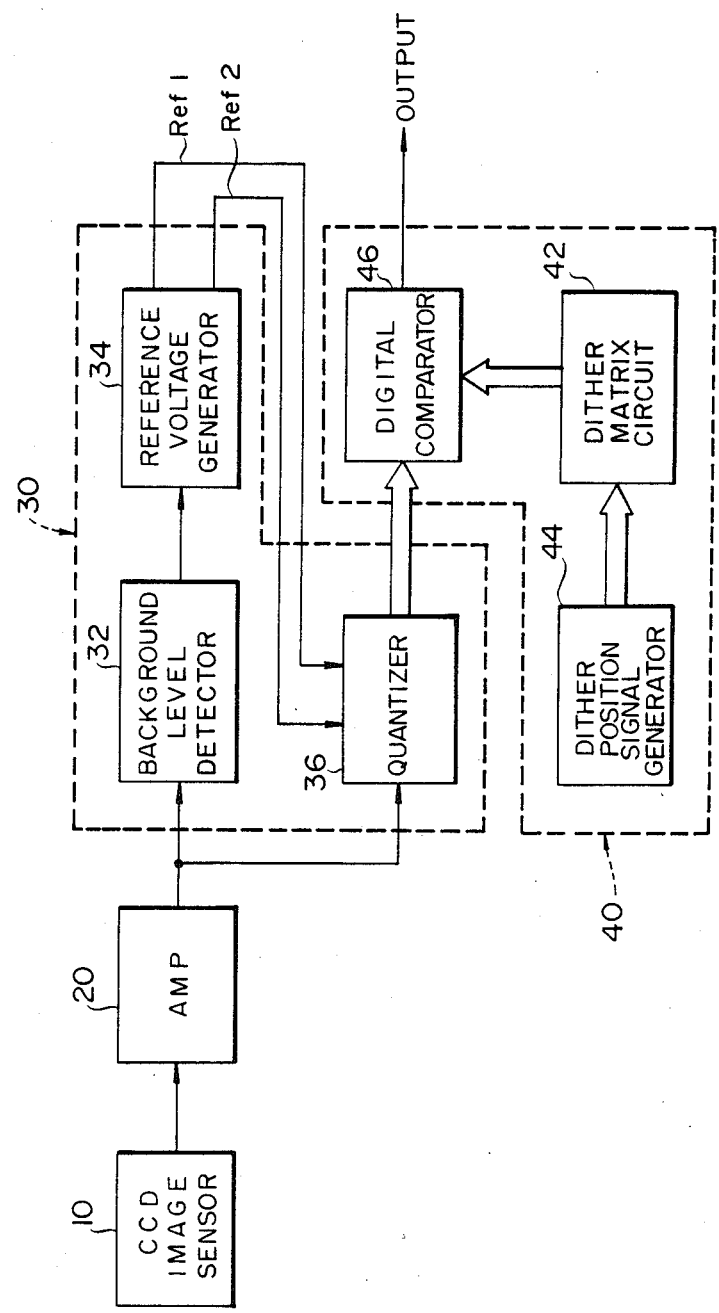
FIG. 1 is a block diagram of a typical example of a circuit for multi-level quantizing and dither processing a picture signal read by an image sensor from a document.

Referring to FIG. 1 of the drawing, there is shown a practical example of a circuit in which a quantizing section 30 quantizes with respect to n-levels an analog picture signal which has been read by a CCD (charge coupled device) image sensor 10 and amplified by an amplifier 20 and, then, the resulting digital picture signal is processed by a dither processing section 40 into two levels.

In the quantizing section 30, a background level detector 32 detects and holds a peak value of an analog picture signal, while a reference voltage generator 34 determines the highest and lowest quantizing levels by dividing the detected background level of a document and, thereby, develops an upper limit reference voltage $Ref_1$ and a lower limit reference voltage $Ref_2$. Further, a quantizing circuit 36 produces, within the range defined by the highest and lowest levels, the digital picture signal provided by n-level quantizing the analog picture signal.

Meanwhile, the dither processing section 40 includes a dither matrix circuit 42 which is loaded with threshold values for processing the digital picture signal output from the quantizing circuit 36 into two levels. A dither position signal generator 44 has a dither counter which, while counting horizontal scan clock pulses and vertical scan clock pulses, generates a signal for sequentially reading predetermined threshold values out of the dither matrix circuit 42. A digital comparator 46 converts the digital picture signal into two levels in response to the threshold values supplied sequentially thereto from the dither matrix circuit 42.

Figure 2:
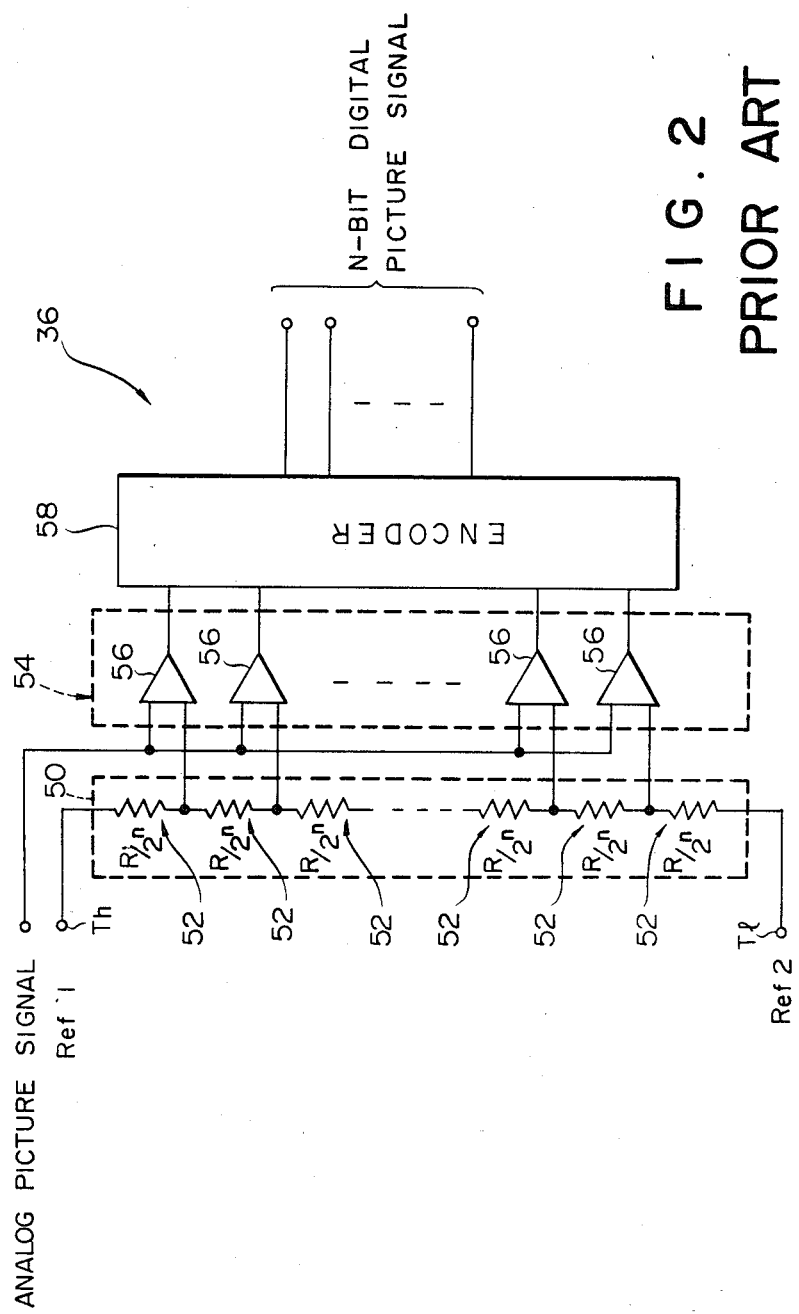
FIG. 2 is a diagram of a prior art picture signal quantizing circuit which employs an AD converter of a parallel comparison type.

The present invention is concerned with an improvement in the quantizing circuit 36 included in the quantizing section 30 as described above. As shown in FIG. 2, the prior art quantizing circuit 36 comprises an analog-to-digital (AD) converter of a parallel comparison type. That is, the AD converter is made up of a reference voltage divider 50 consisting of a series connection of $2^n$ ladder resistors 52, a comparator circuit 54 consisting of $(2^n-1)$ comparators 56 which individually compare the analog picture signal output from the amplifier 20 (FIG. 1) with outputs appearing at the junctions between adjacent ladder resistors 50, and an encoder 58 for generating a digital signal, which is an n-bit binary code, in response to outputs of the comparators 56. The serial ladder resistor connection is furnished with taps Th and Tl to which are supplied the upper limit reference voltage $Ref_1$ and the lower limit reference voltage $Ref_2$ respectively. Assuming that the total resistance of the series connection is R, the resistance of each resistor 52 is selected to be $R/2^n$. This type of prior art quantizing circuit is not fully acceptable concerning the reproducibility of halfone of multi-level quantized picture signals, as previously discussed.

Figure 3:
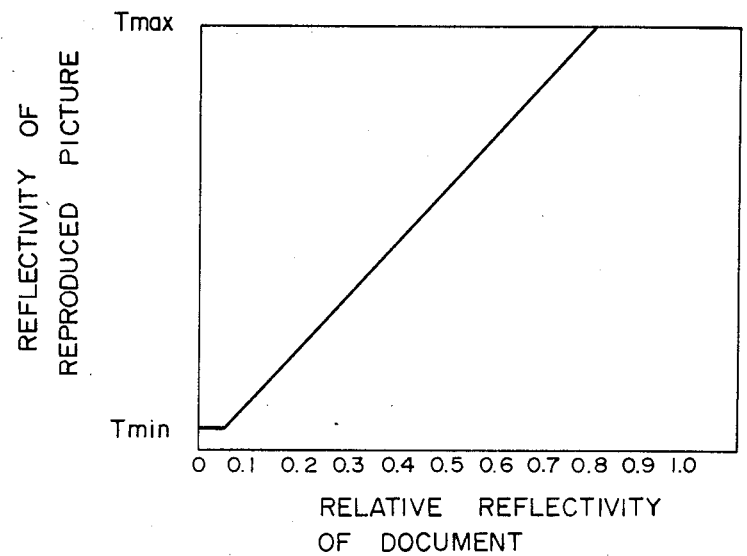
FIG. 3 is a graph showing a reflectivity characteristic of a picture reproduced by dither processing a digital picture signal which is quantized by the prior art quantizing circuit.

In detail, when the quantizer 36 converts an analog picture signal provided by scanning a document into an n-bit digital picture signal and, then, the picture signal is processed into two levels by dither processing which is performed by the digital comparator 46 which halftone presented and, then, the picture is reproduced by a dot printer based on the two-level picture signal, a relationship shown in FIG. 3 is obtained between the reflectivity of a picture on a document and that of a reproduced picture. As shown, the reflectivity of the reproduced picture varies linearly from the reflectivity Tmin of a black area to the reflectivity Tmax of a white area, while the halftone areas are reproduced with reflectivity which lies between Tmin and Tmax. It should be noted that the reflectivity Tmin pertains to a black area in which all the dots in a unit matrix are printed out, and the reflectivity Tmax to a white area in which the number of printed dots in the unit matrix is zero (background of a recording sheet). The reflectivity of the picture on the document shown in FIG. 3 is a value determined relative to the reflectivity of the background of the document "1". Further, in FIG. 3, the characteristic is derived from the assumption that the AD conversion is performed over the range of 5-80% of the detected background level of the document; the tone in the range of 5-80% of the background level is halftone, the tone in the range of 0-50% of the background level is black, and the tone in the range of 80-100% of the background level is white. This allows characters and the like which are not in halftone to be reproduced with desirable quality.

Generally, to reproduce photographs and other halftone pictures with high quality, it is a primary requisite that good reproducibility be attained at the Macbeth densities of 0.5-1.0 in particular and, therefore, reproducibility be accentuated for halftone whose reflectivity ranges from 0.1 to 0.3 relative to the background reflectivity of a document, "1". In accordance with the characteristic shown FIG. 3, halftone is reproduced unconditionally throughout the relative reflectivity range of 0.05-0.8, that is, the reproducibility of halftone in the relative reflectivity range of 0.1-0.3 is not accentuated at all, resulting in poor reproducibility of halftone pictures.

Reference will be made to FIGS. 4-7 for describing in detail a quantizing circuit embodying the present invention which is a solution to the problem encountered with the prior art quantizing circuit 36.

Figure 4:
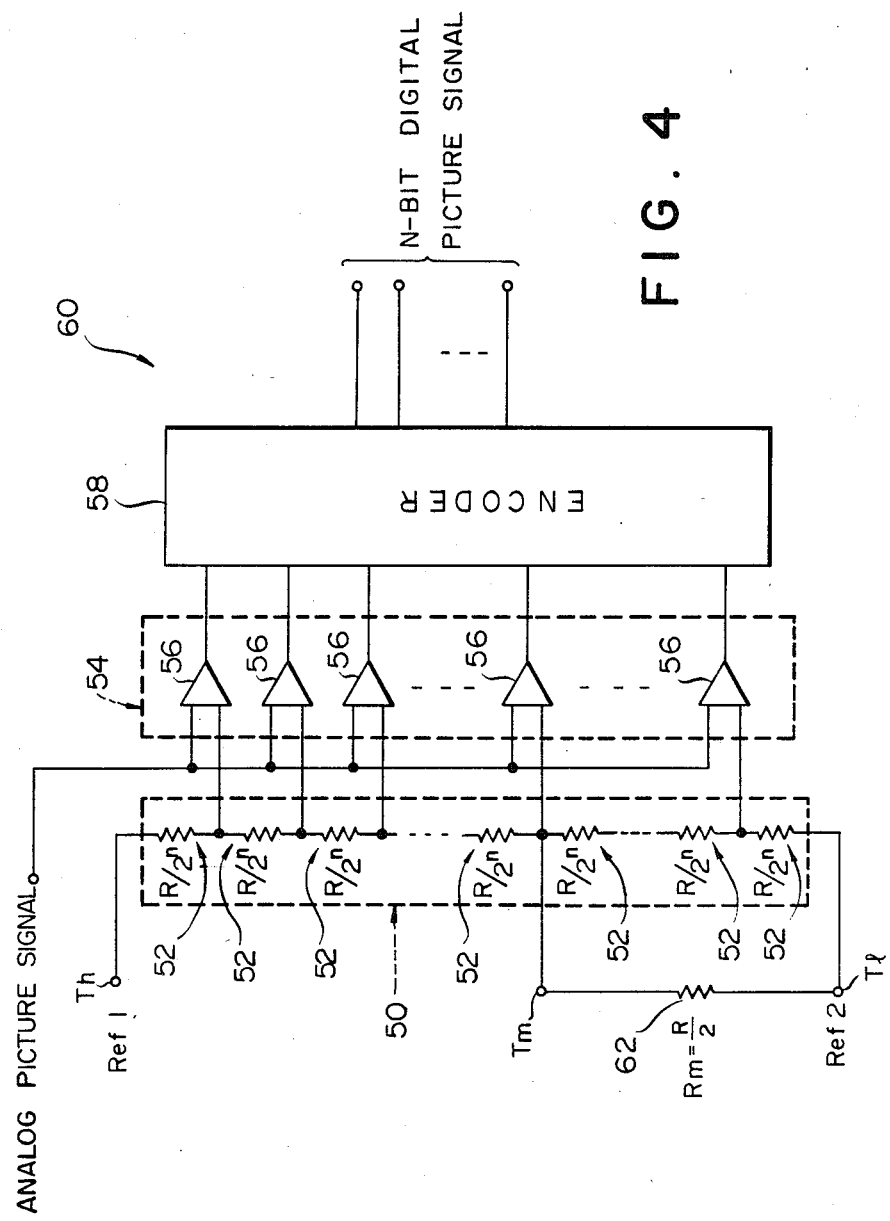
FIG. 4 is a diagram of a quantizing circuit embodying the present invention.

Referring to FIG. 4, a quantizing circuit 60 in accordance with the first embodiment of the present invention is shown. In FIG. 4, the same structural elements as those shown in FIG. 2 are designated by like reference numerals. The quantizing circuit 60 has, in addition to the taps Th and Tl led out from opposite ends of the series connection of the reference voltage divider 50 to receive the upper limit reference voltage $Ref_1$ and the lower limit reference voltage $Ref_2$, an intermediate tap Tm led out from a predetermined position between the taps Th and Tl. The predetermined position between the taps Th and Tl is such that it makes the resistance between the upper limit reference voltage tap Th and the intermediate tap Tm R/2 and the resistance between the intermediate tap Tm and the lower limit reference voltage tap Tl, R/2 (where R is the total resistance of the series connection of the reference voltage divider). A resistor 62 having a resistance Rm is connected between the intermediate tap Tm and the lower limit reference voltage tap Tl. The resistance Rm of the resistor 62 is selected to be R/2 so that the voltage applied across the taps Th and Tm may become double the voltage applied across the taps Tm and Tl.

Figure 5:
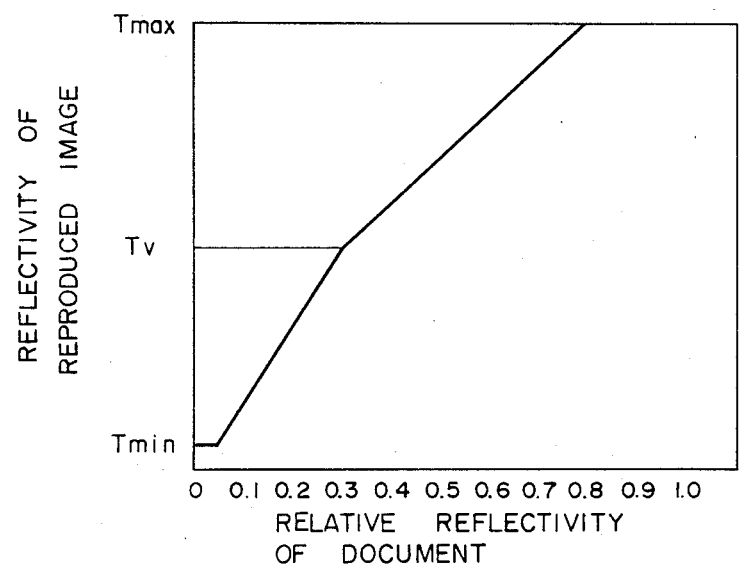
FIG. 5 is a graph representing a reflectivity characteristic of a picture reproduced by dither processing a digital picture signal which is quantized by the quantizing circuit of the present invention.

Using the quantizing circuit 60 with the reference voltage divider 50 constructed as above in accordance with the first embodiment of the present invention as the quantizing circuit 38 shown in FIG. 2, a digital picture signal was quantized and, then, dither processed to reproduce a picture. This provided a characteristic relation between the relative reflectivity of a document and the reflectivity of a reproduced picture as shown in FIG. 5. In FIG. 5, the reflectivity of the reproduced picture bends at a point Tv of Tmax/2. While the tone in the range of 5-30% of the background level of a document and the range of 30-80% are quantized by 2/n with respect to different reference voltages, those in the ranges of 0-5% and 80-100% are respectively processed as black and white as has been the case with the prior art circuitry. It will therefore be seen that a quality picture is reproducible in which halftone is stressed in the document reflectivity range of 0.1-0.3, that is, in dark areas. In the meantime, characters and like images on a document are reproduced without any disturbance as desirably as those attainable with the prior art circuitry.

Figure 6:
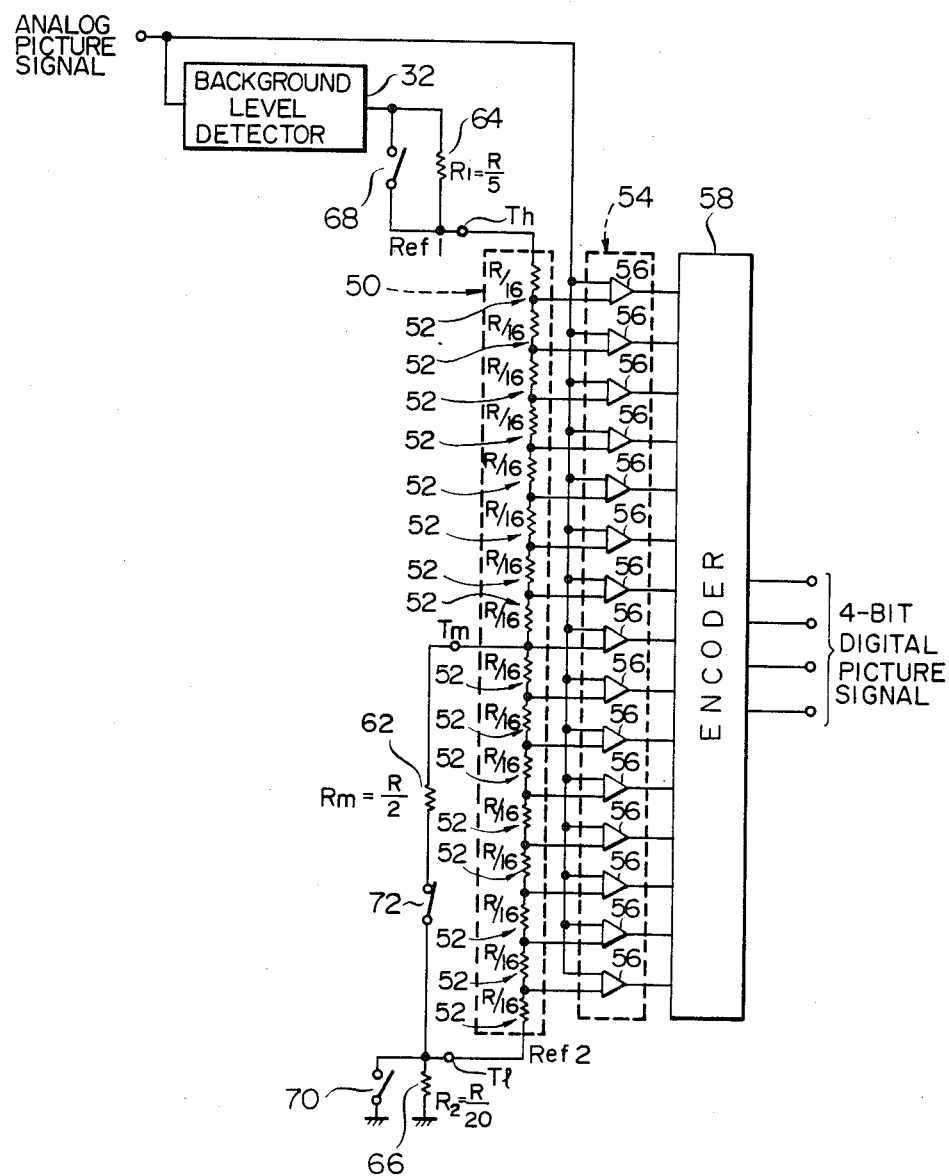
FIG. 6 is a diagram showing a modification to the quantizing circuit of FIG. 4.

For the application of the upper limit and lower limit reference voltages $Ref_1$ and $Ref_2$, a construction shown in FIG. 6 may be employed in place of the reference voltage generator 34 shown in FIG. 1. In FIG. 6, a resistor 64 having a resistance $R_1$ is connected to the upper limit reference voltage tap Th of the reference voltage divider 50 so that the peak value of an analog picture signal detected and held by the background level detector 32 may be directly routed to the series connection of the reference voltage divider 50. Also, a resistor 66 having a resistance $R_2$ is connected to the lower limit reference voltage tap Tl, the other end of the resistor 66 being connected to ground. The construction shown in FIG. 6 represents a case wherein an analog picture signal is to be quantized with respect to sixteen levels. Further, in this particular embodiment, switches 68 and 70 are connected in parallel with the resistors 64 and 66 respectively, while a switch 72 is connected in series with the resistor 62. When the switches 68 and 70 are turned off and the switch 72 is turned on, halftone will be stressed; when the switches 68 and 70 are turned on and the switch 72 is turned off, stressing of halftone will be cancelled.

As described above, the first embodiment of the present invention shown in FIGS. 4 and 6 leads out an intermediate tap from a reference voltage divider and connects a resistor between the intermediate tap and a tap adapted to apply a lower limit reference voltage to the reference voltage divider. Such a construction eliminates linearity in AD conversion to allow an analog picture signal to be quantized with the reproducibility accentuated for halftone in part of the AD conversion range.

Referring to FIG. 7, a second embodiment of the quantizing circuit in accordance with the present invention is shown. In FIG. 7, the same structural elements as those shown in FIGS. 4 and 6 are designated by like reference numerals. In the embodiment of FIG. 7, a third or intermediate reference voltage $Ref_3$ is applied to the intermediate tap Tm. That is, the peak value of an analog picture signal detected and held by the background level detector 32 is sequentially divided by a resistor network which comprises resistors 74, 76, 78 and 80 having resistances $R_3$, $R_4$, $R_5$ and $R_6$ respectively. The resulting reference voltages $Ref_1$, $Ref_2$ and $Ref_3$ are applied to the reference voltage divider 50.

In the construction described above, an analog picture signal lying between the intermediate tap Tm and the lower limit reference voltage tap Tl will be accentuated if the third reference voltage $Ref_3$ is selected such that the voltage applied across the upper limit reference voltage tap Th and tap Tm becomes higher than the voltage applied across the taps Tm and Tl. Predetermined resistances $R_3 = 5R_4$, $R_2 = 10R_4$ and $R_1 = 4R_4$, the quantizing circuit was used as the quantizing circuit of FIG. 2 to multi-level quantize an analog picture signal whereafter the resulting digital picture signal was dither processed to reproduce a picture. Again, the reproduced picture had reflectivity relative to the reflectivity of a document as shown in FIG. 5.

In a prior art quantizing circuit comprising an AD converter with an intermediate tap, a voltage ($Ref_1 + Ref_2$)/2 is applied to the intermediate tap to enhance the linearity in Ad conversion and, thereby, reduce the influence of an input bias current of a comparator. Conversely, in accordance with the illustrated embodiment, the third reference voltage $Ref_3$ is applied to the tap which is led out from an intermediate or other suitable position, thereby cancelling the linearity in AD conversion.

In summary, it will be seen that the present invention provides a picture signal quantizing circuit which is capable of quantizing an analog picture signal while accentuating reproducibility of halftone in part of an AD conversion range. This outstanding advantage is derived from the inherent construction wherein a reference voltage for accentuating part of the analog picture signal is applied to an intermediate tap which is led out from a reference voltage divider, thereby cancelling linearity in AD conversion.

Various modifications will become possible for those skilled in the art after receiving the teachings of the present disclosure without departing from the scope thereof.

What is claimed is:

1. A picture signal quantizing circuit for quantizing with respect to multiple levels an analog picture signal representative of a picture which is read from a document, comprising:

a background level detector for detecting and holding a peak value of the analog picture signal to generate a background level voltage indicative of a background level of the document;

a reference voltage generator for dividing the detected and held background level voltage to determine a highest level and a lowest level for quantization to generate a first reference voltage and a second reference voltage corresponding to the highest level and the lowest level respectively;

a reference voltage divider comprising a series circuit having $2^n$ ladder resistors connected serially to generate different output voltages from junctions between said resistors, a first tap led out from one end of said series circuit, a second tap led out from the other end of the series circuit, and a third tap led out from a predetermined position between said first and second taps;

halftone reproducibility accentuating means for, when quantizing an analog picture signal by comparing the signal with a reference voltage, non-linearly dividing the reference voltage so that a halftone portion of the analog picture signal, and thereby a halftone of a reproduced picture are accentuated;

a comparator circuit comprising $(2^n - 1)$ comparators for respectively comparing the output voltages from the junctions between the resistors of the series connection with the analog picture signal; and an encoder for generating a digital signal in response to outputs of said comparators, said digital signal being an n-bit binary code;

the halftone reproducibility accentuating means comprising a first resistor having a predetermined resistance and connected between the second and third taps;

the resistance of the first resistor being R/2, where R is a total resistance of the series circuit of the reference voltage divider;

the halftone reproducibility accentuating means further comprising a first switch connected in series to the first resistor, a second resistor connected to the first tap, a second switch connected in parallel to the second resistor, a third resistor connected between the second tap and ground, and a third switch connected in parallel to the third resistor.

2. A picture signal quantizing circuit as claimed in claim 1, in which the second resistor has a resistance R/5 and the third resistor has a resistance R/20.

3. A picture signal quantizing circuit as claimed in claim 1, in which the halftone reproducibility accentuating means further comprises an intermediate reference voltage generator for supplying a third reference voltage to the third tap.

4. A picture signal quantizing circuit as claimed in claim 3, in which the intermediate reference voltage is selected such that a voltage applied across the first and third taps becomes higher than a voltage applied across the second and third taps.

5. A picture signal quantizing circuit for quantizing with respect to multiple levels an analog picture signal representative of a picture which is read from a document, comprising:
   a background level detector for detecting and holding a peak value of the analog picture signal to generate a background level voltage indicative of a background level of the document;
   a reference voltage generator for dividing the detected and held background level voltage to determine a highest level and a lowest level for quantization to generate a first reference voltage and a second reference voltage corresponding to the highest level and the lowest level respectively;
   a reference voltage divider comprising a series circuit having $2^n$ ladder resistors connected serially to generate different output voltages from junctions between said resistors, a first tap led out from one end of said series circuit, a second tap led out from the other end of the series circuit, and a third tap led out from a predetermined position between said first and second taps;
   halftone reproducibility accentuating means for, when quantizing an analog picture signal by comparing the signal with a reference voltage, non-linearly dividing the reference voltage so that a halftone portion of the analog picture signal, and thereby a halftone of a reproduced picture are accentuated;
   a comparator circuit comprising $(2^n - 1)$ comparators for respectively comparing the output voltages from the junctions between the resistors of the series connection with the analog picture signal; and
   an encoder for generating a digital signal in response to outputs of said comparators, said digital signal being an n-bit binary code;
   the halftone reproducibility accentuating means comprising a first resistor having a predetermined resistance and connected between the second and third taps;
   the halftone reproducibility accentuating means further comprising a first switch connected in series to the first resistor, a second resistor connected to the first tap, a second switch connected in parallel to the second resistor, a third resistor connected between the second tap and ground, and a third switch connected in parallel to the third resistor.

6. A picture signal quantizing circuit as claimed in claim 5, in which the second resistor has a resistance R/5 and the third resistor has a resistance R/20, where R is a total resistance of the series circuit of the reference voltage divider.

7. A picture signal quantizing circuit as claimed in claim 5, in which the halftone reproducibility accentuating means further comprises an intermediate reference voltage generator for supplying a third reference voltage to the third tap.

8. A picture signal generating circuit as claimed in claim 7, in which the intermediate reference voltage is selected such that a voltage applied across the first and third taps becomes higher than a voltage applied across the second and taps.

* * * * *